AMPLIFIER

Filed Jan. 27, 1959

INVENTOR.
ADISAUN ROJPRASIT

BY

Eyre, Mann & Lucas

ATTORNEYS 3,060,264
Patented Oct. 23, 1962

3,060,264

AMPLIFIER

Adisaun Rojprasit, College Residence Hotel, 601 W. 110th St., New York 25, N.Y.

Filed Jan. 27, 1959, Ser. No. 789,429
8 Claims. (Cl. 179—1)

This invention relates to power amplifier circuits and to an improvement thereon by which higher power output may be achieved at a selected frequency range. As the invention is particularly adapted for use in the power output stage of a high fidelity system it will be described in connection with such specific use.

In high fidelity systems it is desirable to maintain high and uniform power output throughout the frequency range. Because of this need for high and uniform power output the inexpensive audio loudspeakers used in ordinary radios have not been successfully used in high fidelity systems. These loudspeakers at high audio frequencies are inefficient, their volume, for a given power output, decreasing as the frequency increases. The result is poor response and poor reproduction of tone quality at the high frequencies. For this reason very costly audio loudspeakers which have more uniform response throughout the frequency range have had to be used in conventional high fidelity systems.

In accordance with the present invention a simple circuit incorporated in to the power output stage of the audio amplifier markedly increases the power output at high frequencies. The increase can be made large enough to compensate for the decrease in efficiency at high frequencies of the ordinary inexpensive audio loudspeakers. The result is satisfactory response and tonal reproduction with a substantial saving in cost. The inexpensive audio loudspeakers that can be used with the amplifier circuit of the invention are one-tenth the cost or less of conventional high fidelity loudspeakers.

In the new circuit increased output of the power stage at high audio frequencies is obtained by providing a load in the cathode circuit of the power tube or tubes of the output stage that includes capacitance tuned to the inductive impedance of the output transformer in the plate circuit of such tube or tubes at a frequency above say 6 kc. Thus, at frequencies approaching resonance, power delivered to a loudspeaker energized from the output transformer is automatically increased and reduction of speaker output volume is prevented. The load in the cathode circuit may include an output transformer coupled to the loudspeaker or to a second loudspeaker for the lower audio frequencies or may include a coil acting as a choke at the higher frequency range.

For a better understanding of the invention and of an audio amplifier power output stage incorporating the same reference may be had to the accompanying drawing of which:

Figures 1, 2:
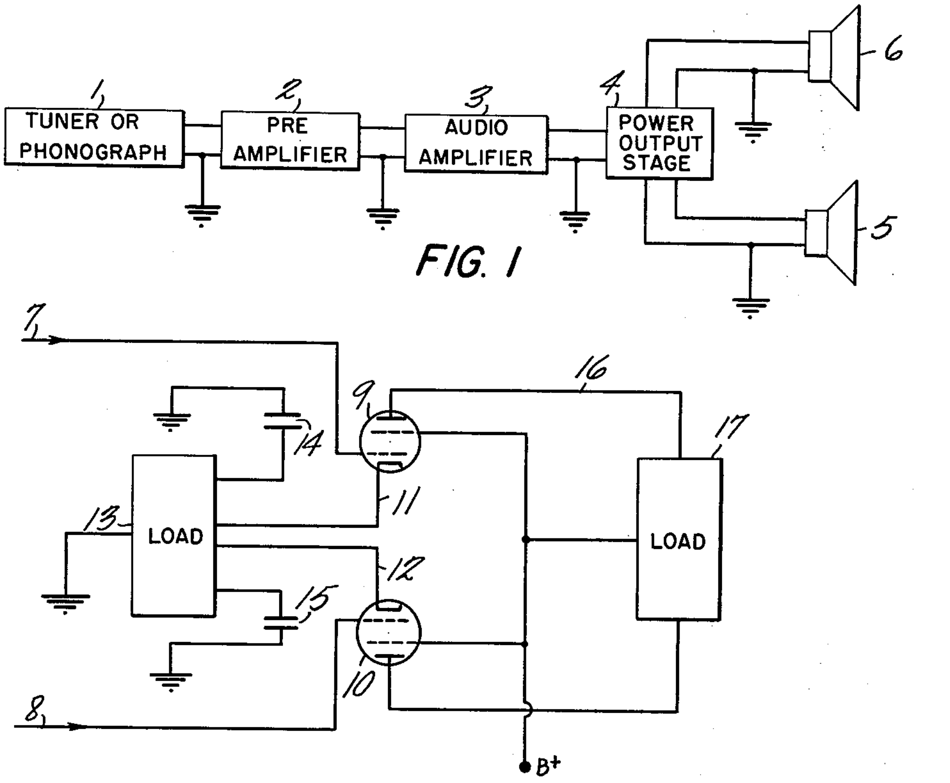
FIG. 1 is a block diagram of the components of a high fidelity system.
FIG. 2 is a diagram of a push-pull audio amplifier power output stage of a high fidelity system and embodying the invention.

In FIG. 1 the usual arrangement of the components of a high fidelity system is shown with a tuner or phonograph 1 connected through a preamplifier 2 to an audio amplifier 3. As the invention will be explained with reference to the last power output stage 4 of the audio amplifier 3, that stage has been shown as a separate component. A high frequency loudspeaker 5 and a low frequency loudspeaker 6 is shown connected to the power output stage 4. Speakers 5 and 6 may be separate speakers or components of a coaxial speaker.

FIG. 2 is a diagram of the power output stage 4 of FIG. 1 arranged for push-pull operation. Input from the audio amplifier 3 to power amplifier tubes 9 and 10 is shown at points 7 and 8. The cathodes of the power amplifier tubes 9 and 10 are connected through leads 11 and 12 to a load 13 and to capacitors 14 and 15. The plate circuit 16 of the power amplifier tubes 9 and 10 is connected to a load 17. Loads 13 and 17 include the loudspeakers 6 and 5 respectively. In accordance with the invention capacitors 14 and 15 are so selected with reference to the load 17 as to provide, at a frequency in the upper audio frequency range, a resonant circuit and thereby, at such frequency range, increase the power delivered to speaker 5, which speaker may therefore be less sensitive at such frequency range.

Figure 3:
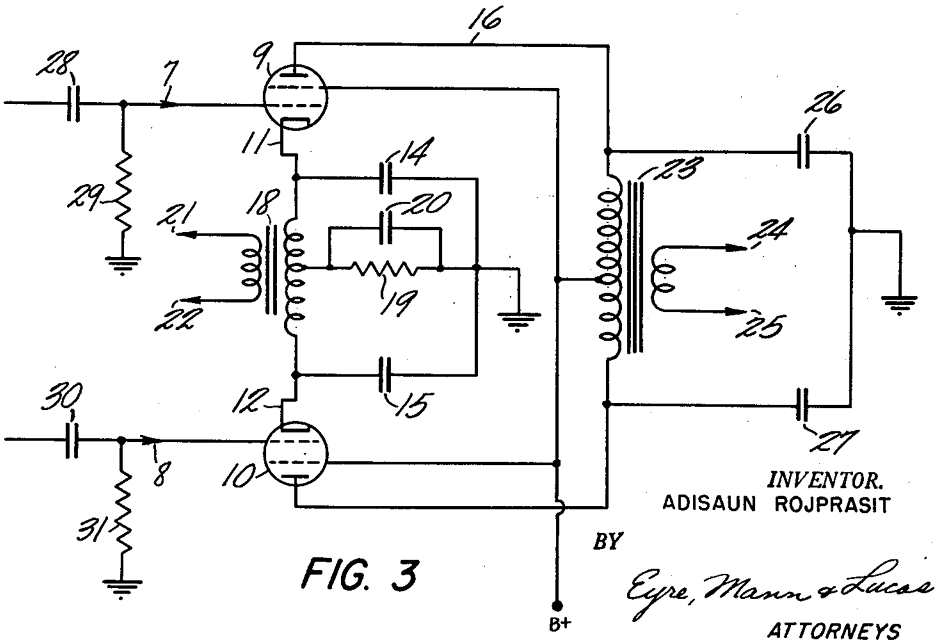
FIG. 3 is a circuit diagram illustrating specific circuit elements that could be employed in the power output stage of FIG. 2.

Suitable components of the loads 13 and 17 are shown in FIG. 3. In this specific embodiment of the invention the primary of an output transformer 18 is connected between leads 11 and 12 and a resistor 19 is connected between a center tap on the primary of transformer 18 and ground. Preferably, as shown, a capacitor 20 is connected across resistor 19. The capacitor 14 is connected between lead 11 and ground and capacitor 15 is connected between lead 12 and ground. The secondary of transformer 18 may be connected at points 21 and 22 with the loudspeaker 6 of FIG. 1. The primary of an output transformer 23 is connected in the plate circuit 16 of the tubes 9 and 10. The secondary of transformer 23 may be connected at points 24 and 25 to the high frequency loudspeaker 5 of FIG. 1. If a coaxial speaker is used, the secondaries of transformers 18 and 23 would be connected in parallel thereto. Operating energy for the circuit is supplied from a suitable source (not shown) of direct current, the negative terminal of which is grounded and the positive terminal of which, indicated by B+, is connected to the center of the primary of transformer 23 and to the screen grids of the tubes 9 and 10. Preferably, a capacitor 26 is connected between the anode of tube 9 and ground and a capacitor 27 is connected between the anode of tube 10 and ground. Input signals from the audio amplifier 3 are transmitted through capacitors 28 and 30, with respective grid resistors 29 and 31, to the control grids of power tubes 9 and 10 by leads 7 and 8.

An illustrative set of specific values of several of the electrical components of the circuit of FIG. 3 are given in the following table. Electrical components having values different from those given in the table could be employed in a system operating in accordance with the invention, as will be obvious to those skilled in the art.

*Table of Illustrative Values of Circuit Components*

| | | |
|---|---|---|
| Capacitor 14 | microfarads | From 0.1 to 1 |
| Capacitor 15 | do | From 0.1 to 1 |
| Resistor 19 | ohms | From 150 to 330 |
| Tube 9 | | 6F6 or EL84 |
| Tube 10 | | 6F6 or EL84 |

From the foregoing description it is apparent that the invention, broadly speaking, comprises elements of a cathode circuit of a tube correlated with the impedance of the anode circuit thereof so as to enhance amplification in a desired frequency range. Thus, although the invention has been described with specific reference to increased power output at high frequencies of the power output stage of high fidelity systems, the invention in its broader aspect, is not limited to such specific application as the principle thereof could be usefully employed whenever it is desired to enhance amplification in a given frequency range as, for example, in a voltage amplifier.

Also various changes in the specific circuit illustrated and described could be made without departing from the spirit of the invention or the scope of the accompanying claims. For example, the circuit need not be connected for push-pull operation, the transformer in the load of the cathode circuit could be replaced by an inductor operating as a choke at the resonant frequency and the capacitors in the cathode circuit could, and preferably would, be variable condensers. They could be replaced by a single ungrounded fixed or variable condenser. Various other alternative arrangements within the scope of the accompanying claims will occur to those skilled in the art.

I claim:

1. In an amplifier stage having an electron tube and an output load circuit connected to the anode thereof, means for enhancing relative amplification in a selected frequency range comprising a load circuit connected to the cathode of the tube having capacitative means connected between the cathode of said tube and ground and tuned for resonance with the impedance of the output load at a frequency in the selected range.

2. In an audio amplifying and reproducing system having an audio power output stage including an electron power tube and an output load coupled to the plate circuit thereof, means for increasing the relative output in the upper audio frequency range comprising a load circuit coupled to the cathode of said tube having capacitative means connected between the cathode of said tube and ground and tuned for resonance with the impedance of the output load at a frequency in the upper audio frequency range.

3. In an audio amplifying and reproducing system having in the power output stage a pair of electron power tubes connected in push-pull and an output transformer coupled thereto, means for increasing the relative output in the upper audio frequency range comprising a load circuit connected to the cathodes of said tubes having capacitative means connected between the cathodes of said tubes and ground and tuned for resonance with the inductive impedance of the output transformer at a frequency in the upper audio frequency range.

4. In a high fidelity audio amplifying and reproducing system having audio reproducing means, an audio power output stage comprising a pair of electron output tubes connected for push-pull operation, an output transformer having its primary coupled to the anodes of said tubes and its secondary connected to said reproducing means, a second output transformer having its primary coupled to the cathodes of said tubes and its secondary connected to said reproducing means, capacitative means connected between the cathodes of said tubes and ground, and a source of operating energy for said stage, the capacitance of said means being so correlated to the impedance of said first transformer as to cause resonance of the output circuit at a frequency in the upper audio frequency range whereby, at frequencies in such range, increased power is delivered to said reproducing means.

5. The audio power output stage of a high fidelity and amplifying and reproducing system according to claim 4 wherein said capacitative means comprise a pair of condensers connected in series between the cathodes of said tubes and ground.

6. The audio power output stage of a high fidelity audio amplifying and reproducing system according to claim 5 including a resistor connected between the mid point of the primary of said second transformer and the junction of said condensers.

7. The audio power output stage of a high fidelity audio amplifying and reproducing system of claim 5 wherein said condensers are of equal capacitance.

8. The audio power output stage of a high fidelity audio amplifying and reproducing system according to claim 4 wherein said reproducing means comprise a high frequency loudspeaker and a low frequency loudspeaker, the secondary of said first transformer being coupled to said high frequency loudspeaker and the secondary of said second transformer being coupled to said low frequency loudspeaker.

References Cited in the file of this patent

UNITED STATES PATENTS

| | | |
|---|---|---|
| 2,603,723 | Thompson | July 15, 1952 |
| 2,846,503 | Kump | Aug. 5, 1958 |

FOREIGN PATENTS

| | | |
|---|---|---|
| 805,284 | Germany | May 15, 1951 |